United States Patent
Hsieh et al.

(10) Patent No.: US 10,867,100 B2
(45) Date of Patent: Dec. 15, 2020

(54) INTEGRATED CIRCUIT DESIGNING SYSTEM

(71) Applicant: TAIWAN SEMICONDUCTOR MANUFACTURING COMPANY, LTD., Hsinchu (TW)

(72) Inventors: Shang-Chih Hsieh, Yangmei (TW); Hui-Zhong Zhuang, Kaohsiung (TW); Ting-Wei Chiang, New Taipei (TW); Chun-Fu Chen, Chiayi (TW); Hsiang-Jen Tseng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/507,763

(22) Filed: Jul. 10, 2019

(65) Prior Publication Data
US 2019/0332736 A1    Oct. 31, 2019

Related U.S. Application Data

(62) Division of application No. 15/356,817, filed on Nov. 21, 2016, now Pat. No. 10,380,306, which is a (Continued)

(51) Int. Cl.
*G06F 30/392* (2020.01)
*G06F 30/39* (2020.01)
(Continued)

(52) U.S. Cl.
CPC .......... *G06F 30/392* (2020.01); *G06F 30/39* (2020.01); *H03K 19/02* (2013.01); *H01L 27/0207* (2013.01)

(58) Field of Classification Search
USPC ....................................... 716/119
See application file for complete search history.

(56) References Cited

U.S. PATENT DOCUMENTS

| 6,035,106 A | 3/2000 | Carruthers et al. |
| 6,536,028 B1 | 3/2003 | Katsioulas et al. |

(Continued)

FOREIGN PATENT DOCUMENTS

| TW | 200535653 | 11/2005 |
| TW | I274413 | 2/2007 |

(Continued)

OTHER PUBLICATIONS

Office Action dated Jun. 16, 2015 from corresponding No. TW 103115773.

*Primary Examiner* — Bryce M Aisaka
(74) *Attorney, Agent, or Firm* — Hauptman Ham, LLP

(57) ABSTRACT

An integrated circuit designing system includes a non-transitory storage medium encoded with a first set of standard cell layouts and a second set of standard cell layouts both being configured to perform a predetermined function. The predetermined manufacturing process having a nominal minimum pitch (T) of metal lines. Each standard cell layout of the first set of standard cell layouts and the second set of standard cell layouts having a cell height (H) wherein the cell height is a non-integral multiple of the nominal minimum pitch. A hardware processor communicatively is coupled with the non-transitory storage medium and is configured to execute a set of instructions for generating an integrated circuit layout based on the first set of standard cell layouts, the second set of standard cell layouts and the nominal minimum pitch; and creating a data file corresponding to the integrated circuit layout.

20 Claims, 5 Drawing Sheets

Related U.S. Application Data division of application No. 14/051,881, filed on Oct. 11, 2013, now Pat. No. 9,501,600.

(60) Provisional application No. 61/818,685, filed on May 2, 2013.

(51) Int. Cl.
*H03K 19/02* (2006.01)
*H01L 27/02* (2006.01)

(56) References Cited

U.S. PATENT DOCUMENTS

| | | |
|---|---|---|
| 9,158,877 B2 | 10/2015 | Hsieh et al. |
| 9,659,129 B2 | 5/2017 | Hsieh et al. |
| 2005/0196689 A1 | 9/2005 | Nolscher et al. |
| 2006/0136848 A1 | 6/2006 | Ichiryu et al. |
| 2006/0289861 A1 | 12/2006 | Correale, Jr. |
| 2007/0294648 A1 | 12/2007 | Allen et al. |
| 2008/0073588 A1 | 3/2008 | Kruit |
| 2008/0134118 A1 | 6/2008 | Tomar et al. |
| 2011/0156103 A1 | 6/2011 | Penzes |
| 2014/0181774 A1* | 6/2014 | Hatamian ............ G06F 30/392 716/122 |

FOREIGN PATENT DOCUMENTS

| | | |
|---|---|---|
| TW | I295826 | 4/2008 |
| TW | I348631 | 9/2011 |

\* cited by examiner

INTEGRATED CIRCUIT DESIGNING SYSTEM

PRIORITY CLAIM

The present application is a divisional of U.S. application Ser. No. 15/356,817, filed Nov. 21, 2016, which is a divisional of U.S. application Ser. No. 14/051,881, filed Oct. 11, 2013, now U.S. Pat. No. 9,501,600, issued Nov. 22, 2016, which claims the priority of U.S. Provisional Application No. 61/818,685, filed May 2, 2013, which are incorporated herein by reference in their entireties.

RELATED APPLICATIONS

The present application relates to applications Ser. No. 14/253,205, filed Apr. 15, 2014, now U.S. Pat. No. 9,659,129, issued May 23, 2017 and Ser. No. 14/015,924, filed Aug. 20, 2013, now U.S. Pat. No. 9,158,877, issued Oct. 13, 2015, the disclosures of which are incorporated herein by reference in their entireties.

BACKGROUND

In the design of an integrated circuit, standard cells having predetermined functions are used. Pre-designed layouts of standard cells are stored in cell libraries. When designing an integrated circuit, the pre-designed layouts of the standard cells are retrieved from the cell libraries and placed into one or more desired locations on an integrated circuit layout. Routing is then performed to connect the standard cells with each other using metal lines. The integrated circuit layout is thereafter used to manufacture the integrated circuit using a predetermined semiconductor manufacturing process.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
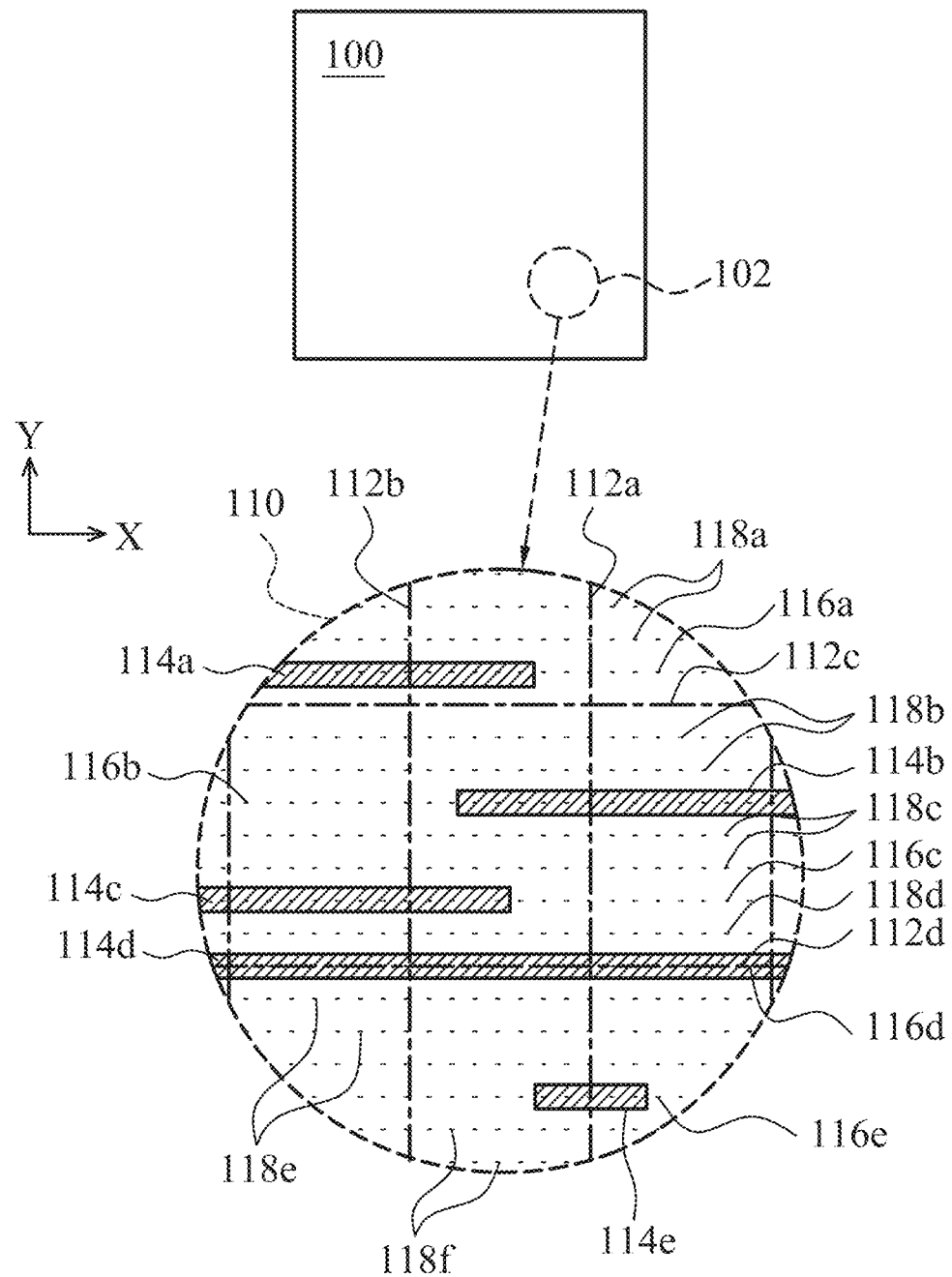
FIG. 1 is a top view of an integrated circuit, including an enlarged view of a portion of the integrated circuit, in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a top view of an integrated circuit 100, including an enlarged view 110 of a portion 102 of the integrated circuit, in accordance with one or more embodiments. The integrated circuit 100 includes a plurality of pre-designed circuit blocks also referred to as standard cells (having cell boundaries indicated by reference lines 112a and 112b along the Y direction and 112c and 112d along the X direction). One or more layers of interconnection structures, such as metal lines 114a, 114b, 114c, 114d, and 114e, are formed over the standard cells. Cell boundaries define cell regions of standard cells, and the cell regions of neighboring standard cells do not overlap. In some embodiments, at least one layer of the layers of interconnection structures is routed along a predetermined direction (e.g., the X direction), and at least another one layer of the layers of interconnection structures is routed along another predetermined direction (e.g., the Y direction). In some embodiments, different layers of interconnection structures are connected by via plugs.

In FIG. 1, details of the standard cells are omitted. In some embodiments, one or more of the standard cells are logic gate cells. In some embodiments, logic gate cells include AND, OR, NAND, NOR, XOR, INV, AND-OR-Invert (AOI), OR-AND-Invert (OAI), MUX, Flip-flop, BUFF, Latch, delay, or clock cells. In some embodiments, each of the standard cells includes at least one active device, such as a metal-oxide semiconductor field effect transistor, a junction field effect transistor, a bipolar junction transistor, or other suitable active device.

Figure 2A:
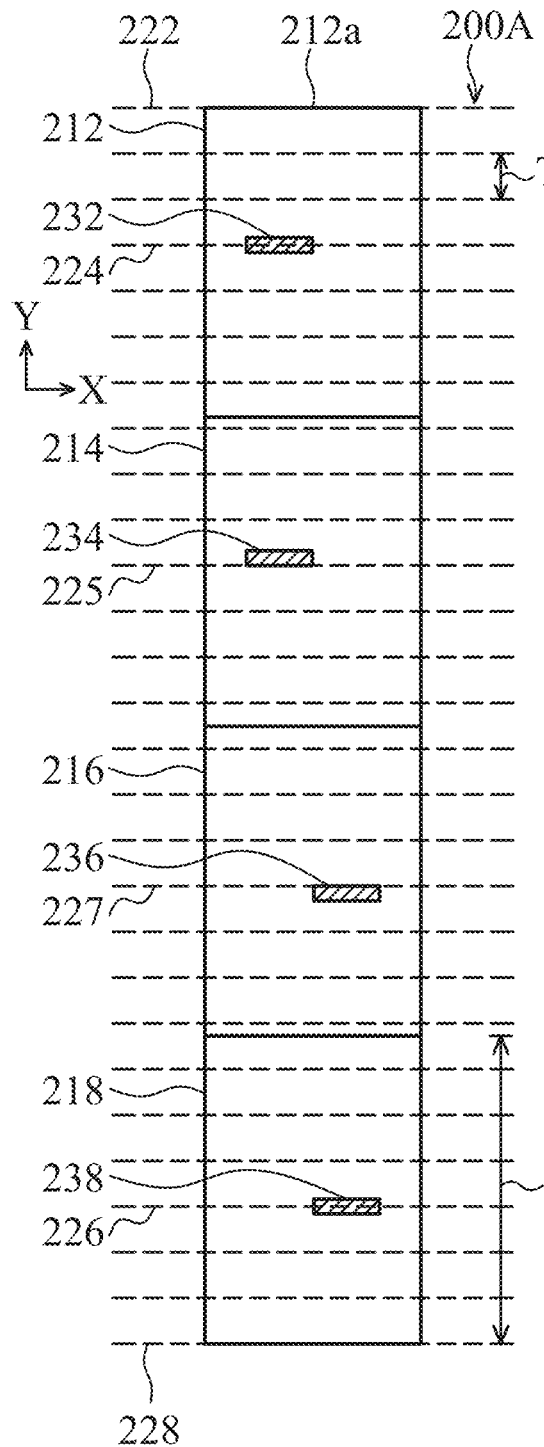
FIG. 2A is a top view of a portion of a layout scheme for an integrated circuit having an arrangement of standard cells and virtual grid lines in accordance with one or more embodiments.

Metal lines 114a, 114b, 114c, 114d, and 114e extend along the X direction and overlap corresponding virtual grid lines 116a, 116b, 116c, 116c, 116d, and 116e. Virtual grid line 116d coincides with cell boundary 112d. Virtual grid lines 116a-e and other virtual grid lines 118a-f are arranged in parallel along the X direction, and two adjacent lines of the plurality of virtual grid lines 116a-e and 118a-f are separated by a nominal minimum pitch T (FIG. 2A). The nominal minimum pitch T is a predetermined minimum routing pitch of metal lines for forming interconnection structure according to a predetermined semiconductor manufacturing process. In some embodiments, the nominal minimum pitch T is determined according to one or more characteristics of the predetermined semiconductor manufacturing process, including a wavelength for a lithographic process, a selectivity of an etching process, a material of the metal lines, a reasonable tolerance of errors, and an expected yield rate of the predetermined semiconductor manufacturing process. In a place and routing software tool, the metal lines of an integrated circuit layout along the X direction are arranged (also known as "routing") according to the virtual grid lines 116a-e and 118a-f.

In some embodiments, each of the metal lines 114a-e includes a multi-layer structure including at least one barrier layer and a conductive layer. In some embodiments, one or more of the metal lines are replaceable by conductive lines including a non-metal conductive material.

FIG. 2A is a top view of a portion of a layout scheme 200A for an integrated circuit having an arrangement of standard cells 212, 214, 216, and 218 and virtual grid lines (such as lines 222, 224, 225, 226, 227, 228, and other horizontal dashed lines not labeled in FIG. 2A) in accordance with one or more embodiments. The layout scheme 200A is usable to be further developed into an integrated circuit layout for manufacturing an integrated circuit, such as integrated circuit 100. The integrated circuit is manufactured by a predetermined manufacturing process having a nominal minimum pitch T for metal lines.

The nominal minimum pitch defining a plurality of virtual grid lines arranged in parallel along the Y direction, and two adjacent lines of the plurality of virtual grid lines are separated by the nominal minimum pitch T. When a placing and routing software tool places metal lines along the X direction, the metal lines coincide with corresponding virtual grid lines. Further details of layout patterns for forming electrical components within standard cells 212, 214, 216, and 218 and metal lines are omitted to avoid obscuring the description.

Standard cells 212, 214, 216, and 218 have a cell height H, and the cell height H is a non-integral multiple of the nominal minimum pitch T. In the embodiment depicted in FIG. 2A, a ratio of the cell height H to the nominal minimum pitch T is 6.75 (i.e., H=6.75 T). In some embodiments, a ratio of the cell height H to the nominal minimum pitch T ranges from 6 to 16. In the present disclosure, various layouts of standard cells generated by rotating and/or mirroring the same layout design are considered to be the same layout. Standard cells 212 and 214 have the same layout positioned to have the same orientation, and standard cells 216 and 218 have the same layout as that of standard cells 212 and 214 and rotated by 180 degrees. Each standard cell 212, 214, 216, and 218 has a corresponding conductive line 232, 234, 236, and 238 configured to be connected to metal lines outside the standard cells. Therefore, conductive lines 232, 234, 236, and 238 are also identified as input/output ports of the corresponding standard cells 212, 214, 216, and 218. In some embodiments, each standard cell has more than one input/output port.

Using standard cell 212 as an example, the center of the input/output port 238 is positioned three nominal minimum pitches (3 T) from an upper boundary 212a of standard cell 212. Because the upper boundary 212a coincides with the virtual grid line 222, the center of the input/output port 232 also coincides with a corresponding virtual grid line 224, which is the third virtual grid line below the virtual grid line 222. Similarly, the center of the input/output port 238 also coincides with a corresponding virtual grid line 226, which is the third virtual grid line above the virtual grid line 228. However, because none of the cell boundaries of standard cells 214 and 216 coincides with any of the virtual grid lines, the center of the input/output port 234 is displaced from the corresponding nearest virtual grid line 225 by 0.25 T, and the center of the input/output port 236 is displaced from the corresponding nearest virtual grid line 227 by 0.25 T. Because the metal lines are placed on the virtual grid lines, the input/output ports 234 and 236 also fail to align with any metal lines to be positioned in the interconnection layer immediately thereon.

Figure 2B:
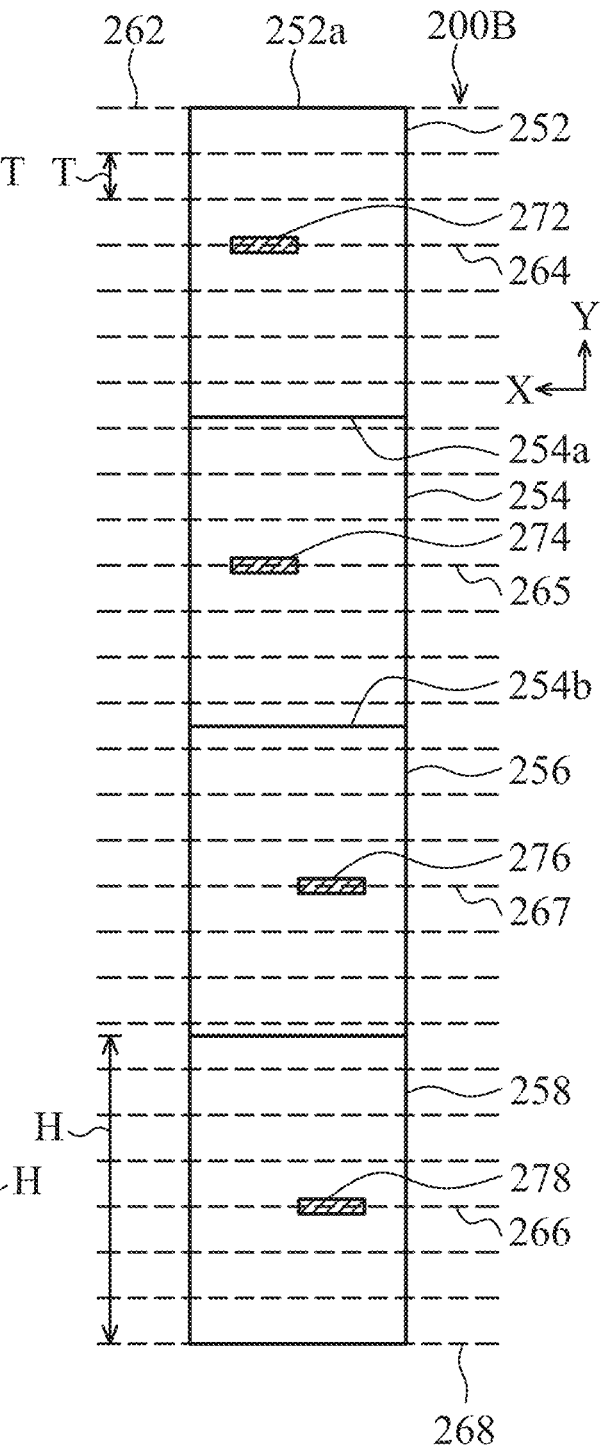
FIG. 2B is a top view of a portion of a layout scheme for an integrated circuit having another arrangement of standard cells and virtual grid lines in accordance with one or more embodiments.

FIG. 2B is a top view of a portion of a layout scheme 200B for an integrated circuit having another arrangement of standard cells 252, 254, 256, and 258 and virtual grid lines (such as lines 262, 264, 265, 266, 267, 268, and other horizontal dashed lines not labeled in FIG. 2B) in accordance with one or more embodiments. The layout scheme 200B is also usable to be further developed into an integrated circuit layout for manufacturing an integrated circuit, such as integrated circuit 100. The integrated circuit is manufactured by a predetermined manufacturing process having a nominal minimum pitch T for metal lines.

The nominal minimum pitch T defines a plurality of virtual grid lines arranged in parallel along the Y direction, and an adjacent two of the plurality of virtual grid lines are separated by the nominal minimum pitch T. When a placing and routing software tool places metal lines along the X direction, the metal lines coincide with corresponding virtual grid lines. Further details of layout patterns for forming electrical components within standard cells 252, 254, 256, and 258 and metal lines are omitted to avoid obscuring the description.

Standard cells 252, 254, 256, and 258 also have a cell height H, and the cell height H is a non-integral multiple of the nominal minimum pitch T. In the embodiment depicted in FIG. 2B, the cell height H is 6.75 T. In some embodiments, a ratio of the cell height H to the nominal minimum pitch T ranges from 6 to 16. Standard cell 252 has a first type layout, standard cell 258 has the first type layout rotated by 180 degrees, standard cell 254 has a second type layout, and standard cell 256 has the second type layout rotated by 180 degrees. Four conductive lines 272, 274, 276, and 278 function as input/output ports of the corresponding standard cells 252, 254, 256, and 258. In some embodiments, each standard cell has more than one input/output port.

Standard cell 252 has an upper cell boundary 252a and a lower cell boundary 254a separated along the Y direction, the upper cell boundary 252a coincides with one of the plurality of virtual grid lines, and the lower cell boundary 254a does not coincide with any of the plurality of virtual grid lines. The center of the input/output port 272 is positioned three nominal minimum pitches (3 T) from an upper boundary 252a of standard cell 252. Because the upper boundary 252a coincides with the virtual grid line 262, the center of the input/output port 272 also coincides with a corresponding virtual grid line 264, which is the third virtual grid line below the virtual grid line 262. Similarly, the center of the input/output port 278 also coincides with a corresponding virtual grid line 266, which is the third virtual grid line above the virtual grid line 268.

Standard cell 254 has an upper cell boundary 254a (also the lower cell boundary of standard cell 252 in this embodiment) and a lower cell boundary 254b separated along the Y direction. The upper cell boundary 254a and the lower cell boundary 254b do not coincide with any of the plurality of virtual grid lines. According to the second type of layout, the center of the input/output port 274 is positioned 3.25 T from an upper boundary 254a of standard cell 254. Although the upper boundary 254a does not coincide with any of the virtual grid lines, the second type layout is designed to have the center of the input/output port 274 coincide with a corresponding virtual grid line 265. Similarly, the center of the input/output port 276 also coincides with a corresponding virtual grid line 267.

Accordingly, input/output ports 272, 274, 276, and 278 are all arranged to be aligned with corresponding metal lines of an interconnection layer immediately above. Comparing the layout scheme 200A depicted in FIG. 2A and the layout scheme 200B depicted in FIG. 2B, interconnection made to input/output ports 234 and 236, in some embodiments, requires at least another layer of metal lines that are routed along virtual grid lines in parallel with the Y direction. As a result, the layout scheme 200B further reduces the restraints imposed to interconnection routing, which in turn leads to less routing resources needed and/or superior interconnection performance.

For standard cells configured to perform a predetermined function, such as a logic operation including one or more of AND, OR, NAND, NOR, XOR, INV, AOI, OAI, MUX, Flip-flop, BUFF, Latch, delay, or clock operations, in the integrated circuit according to the embodiment depicted in FIG. 2B, various types of layout are pre-designed for accommodating different relative positions between standard cells and virtual grid lines or metal lines. In some embodiments, standard cells of different functions also have various types of pre-designed layout available to a placing and routing tool for accommodating different relative positions between standard cells and virtual grid lines.

Figure 2C:
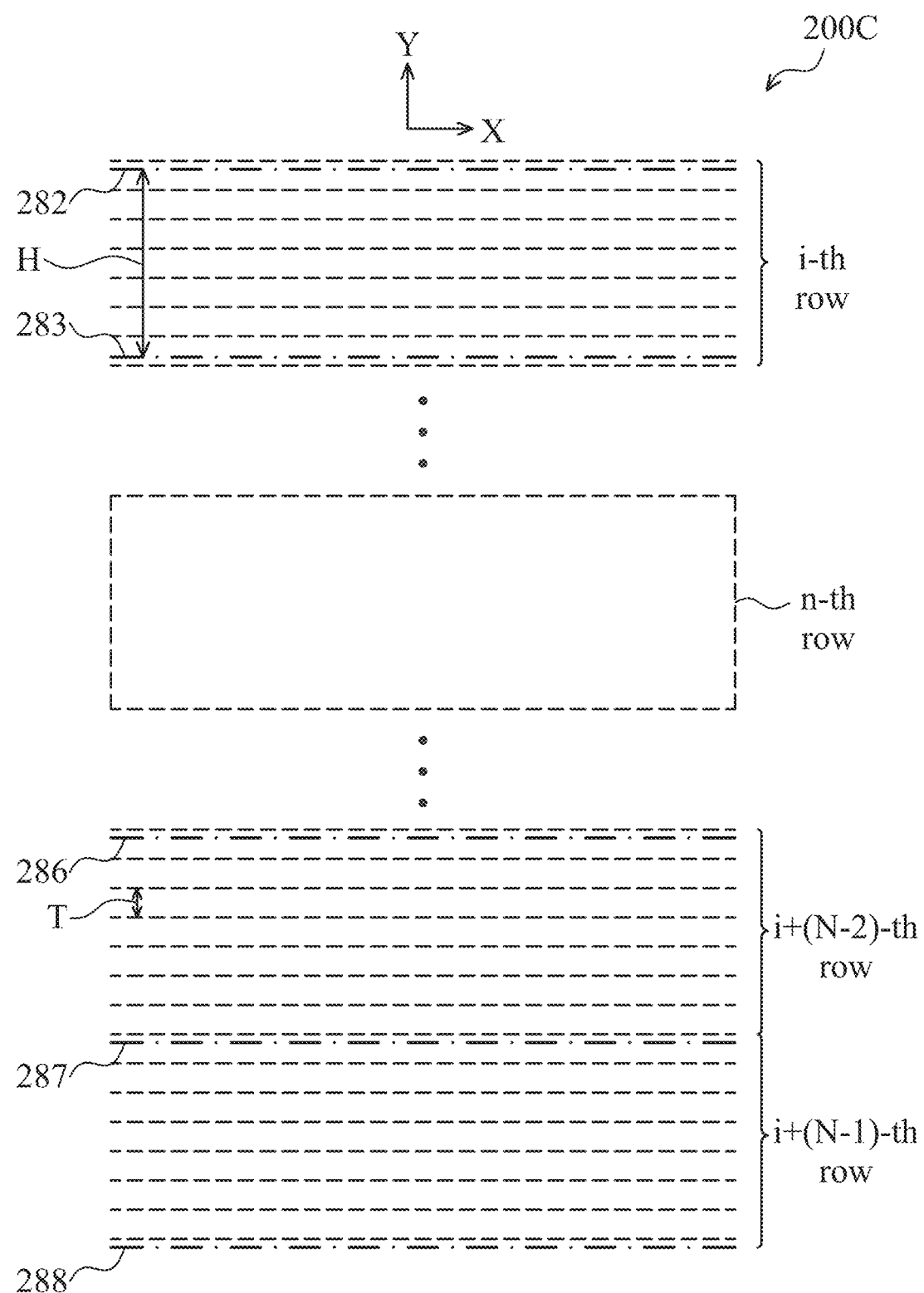
FIG. 2C is a top view of a portion of a layout plan for an integrated circuit in accordance with one or more embodiments.

FIG. 2C is a top view of a portion of a layout plan 200C for an integrated circuit in accordance with one or more embodiments. A plurality of virtual grid lines (depicted as unlabeled horizontal dashed lines) are arranged in parallel along the X direction, and two adjacent lines of the plurality of virtual grid lines are separated by a nominal minimum pitch T. FIG. 2C also depicts N cell rows (as allocated according to row boundaries 282, 283, 286, 287, and 288), including i-th cell row to (i+N−1)-th cell row sequentially arranged along direction Y. When operating a placing and routing tool, a standard cell is to be placed at (i+n)-th row of the N cell rows. N and i are positive integers, and n is a non-negative integer. The cell rows, as well as the standard cells to be placed in the cell rows, have a cell height H. Also, a predetermined manufacturing process for manufacturing the resulting integrated circuit according to the integrated circuit layout has the nominal minimum pitch T. In some embodiments, N is a smallest integer that N*H is an integral multiple of the nominal minimum pitch T. In the present embodiment depicted in FIG. 2C, H=6.75 T, and N=4. In some embodiments, N ranges from 2 to 8. In some embodiments, a ratio of the cell height H to the nominal minimum pitch T ranges from 6 to 16.

Only N cell rows and their corresponding virtual grid lines are depicted in FIG. 2C. In an integrated circuit layout or a layout plan for the integrated circuit layout, more cell rows and corresponding virtual grid lines are used to plan the placement of standard cells. Also, a person having ordinary skill in the art would appreciate that the layout plan 200C is usable to manufacture an integrated circuit 100 depicted in FIG. 1 and/or to develop an integrated circuit layout partially depicted in FIG. 2B.

As described in conjunction with FIG. 2B, for placing a cell configured to perform a predetermined function, a set of standard cells configured to perform the predetermined function is pre-designed and available for selection. A database collecting the set of standard cells and/or many other sets of standard cells for other functions is also referred to as a cell library. N cell rows have N different levels of spatial offset between standard cells and virtual grid lines, and half of the N different offsets are geometrically mirrored counterparts of the other half of the N different offsets. Therefore, in some embodiments, in order to provide tailor-designed input/output port positions for standard cells having various levels of spatial offset to virtual grid lines, the set of standard cells has at least $$\left\lceil \frac{N}{2} \right\rceil$$

(the smallest integer that is no less than $$\frac{N}{2})$$

different layouts. Accordingly, by selecting proper types of layouts corresponding to the same predetermined function, centers of input/output ports of corresponding standard cells placed in the integrated circuit layout thus coincide with corresponding virtual grid lines.

Figure 3:
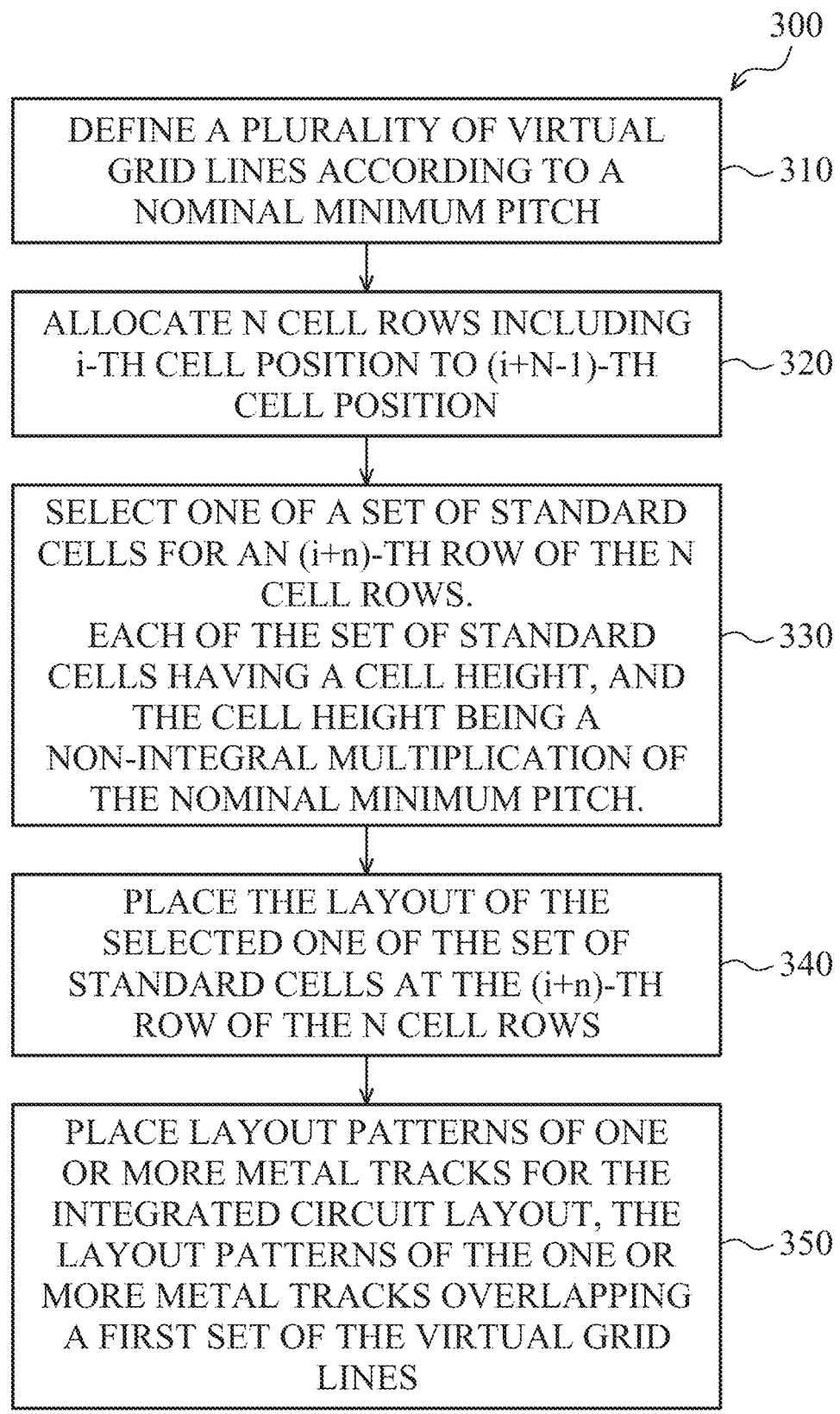
FIG. 3 is a flow chart of a method of designing an integrated circuit layout in accordance with one or more embodiments.

FIG. 3 is a flow chart of a method 300 of designing an integrated circuit layout in accordance with one or more embodiments. It is understood that additional operations may be performed before, during, and/or after the method 300 depicted in FIG. 3, and that some other processes may only be briefly described herein.

In order to manufacture the integrated circuit including a standard cell as described above in conjunction with the standard cell 200 depicted in FIG. 2 using a predetermined manufacturing process, an integrated circuit layout (414a in FIG. 4) is generated based on a circuit design (414b) stored in a schematic format or a circuit description language format. In some embodiments, the method 300 is performed by a hardware processor (412) executing a set of instructions (414c).

In operation 310, as depicted in FIGS. 3 and 2C, a plurality of virtual grid lines is defined. The plurality of virtual grid lines are arranged in parallel along the X direction, and adjacent two of the plurality of virtual grid lines being separated, along the Y direction, by a nominal minimum pitch T of metal lines corresponding to a predetermined manufacturing process.

In operation 320, as depicted in FIGS. 3 and 2C, N cell rows, including i-th cell row to (i+N−1)-th cell row, are allocated for the integrated circuit layout. N cell rows are sequentially arranged along the Y direction, and N and i are positive integers. In some embodiments, the allocating N cell rows is performed in a manner that a lower-most row boundary 288 and an upper-most row boundary 282 of the N cell rows coincide with corresponding ones of the plurality of virtual grid lines.

Figure 4:
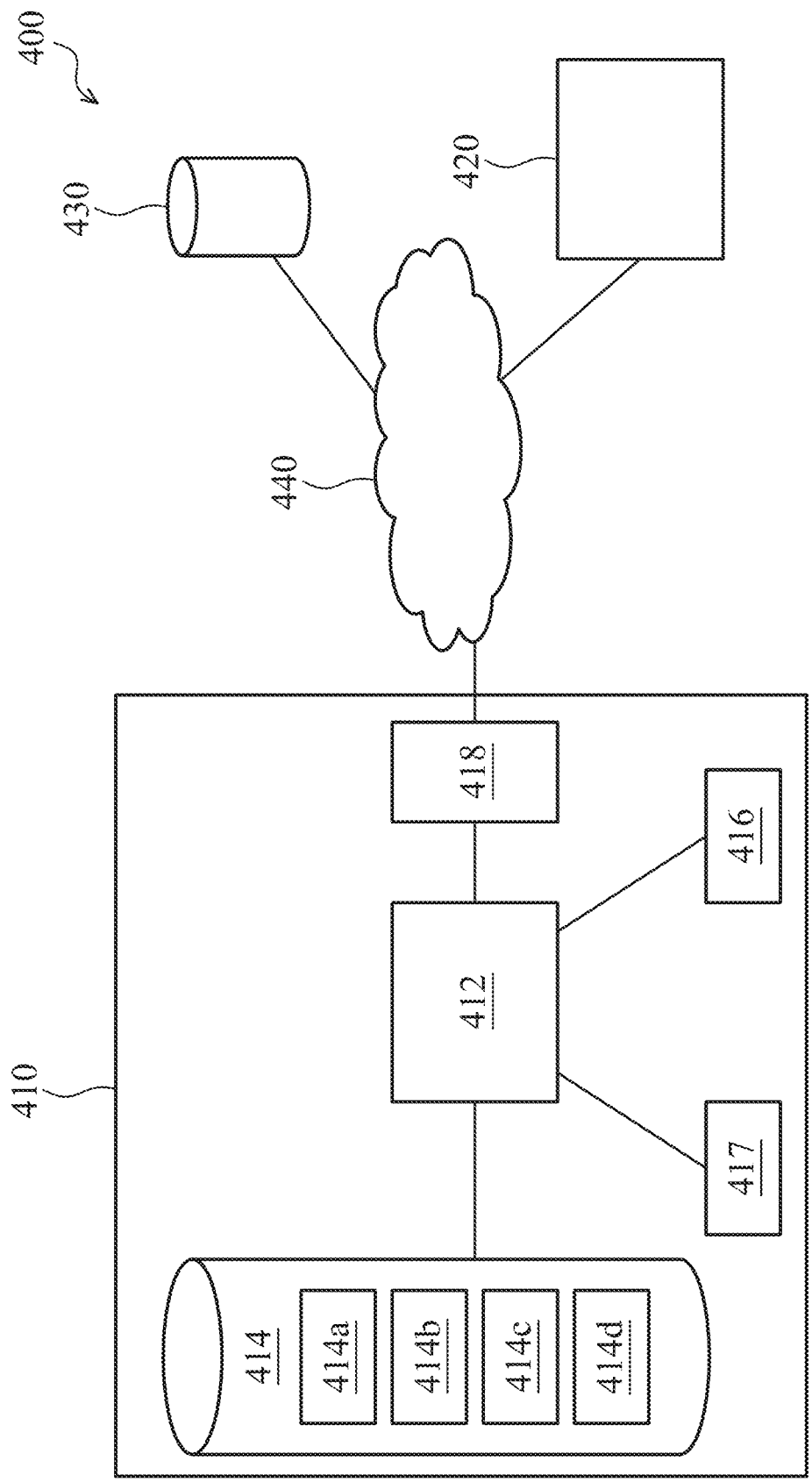
FIG. 4 is a functional block diagram of an integrated circuit designing system in accordance with one or more embodiments.

In operation 330, as depicted in FIGS. 3, 2C, and 4, one of a set of standard cells (414d) for an (i+n)-th row of the N cell rows is selected, where n is a non-negative integer. The set of standard cells includes at least $$\left\lceil \frac{N}{2} \right\rceil$$

(the smallest integer that is no less than $$\frac{N}{2})$$

different layouts corresponding to the predetermined manufacturing process. The set of standard cells is configured to perform a predetermined function and have a size comparable to each of the N cell rows. Each of the set of standard cells have a cell height (H), and the cell height is a non-integral multiple of the nominal minimum pitch T. In some embodiments, the predetermined function is a logic operation including one or more of AND, OR, NAND, NOR, XOR, INV, AOI, OAI, MUX, Flip-flop, BUFF, Latch, delay, or clock operations.

In some embodiments, a ratio of the cell height H to the nominal minimum pitch T ranges from 6 to 16. In some embodiments, N is a smallest integer that N*H is an integral multiple of the nominal minimum pitch T. In some embodiments, a ratio of the cell height H to the nominal minimum pitch T is 6.75, and N is 4. As such, in some embodiments, all row boundaries 283, 286, and 287 but the lower-most row boundary 288 and the upper-most row boundary 282 of the N cell rows do not coincide with any of the plurality of virtual grid lines.

In some embodiments, the selection of one of the set of standard cells is performed by selecting a k-th type standard cell of the set of standard cells according to the following equations:

$$k = (n+1), \text{ if } n \text{ is less than } \frac{N}{2}; \text{ and}$$

$$k = (N-n), \text{ if } n \text{ is no less than } \frac{N}{2}.$$

In operation 340, as depicted in FIGS. 3, 2B, and 2C, the layout of the selected standard cell is placed at the (i+n)-th cell row for forming the integrated circuit layout. In some embodiments, the standard cell is selected and placed in a manner that the centers of input/output ports of the selected standard cell are positioned coinciding with a first set of the virtual grid lines.

In operation 350, as depicted in FIGS. 3 and 1, layout patterns of one or more metal lines (such as metal lines 114a-114e) are placed for forming the integrated circuit layout in a manner that the layout patterns of the one or more metal lines overlapping a second set of the virtual grid lines 116a-e.

FIG. 4 is a functional block diagram of an integrated circuit designing system 400 in accordance with one or more embodiments. Integrated circuit designing system 400 includes a first computer system 410, a second computer system 420, a networked storage device 430, and a network 440 connecting the first computer system 410, the second computer system 420, and the networked storage device 430. In some embodiments, one or more of the second computer system 420, the storage device 430, and the network 440 are omitted.

The first computer system 410 includes a hardware processor 412 communicatively coupled with a non-transitory, computer readable storage medium 414 encoded with, i.e., storing, a generated integrated layout 414a, a circuit design 414b, a computer program code 414c, i.e., a set of executable instructions, and a standard cell library having layouts of sets of standard cells 414d. The processor 412 is electrically and communicatively coupled with the computer readable storage medium 414. The processor 412 is configured to execute a set of instructions 414c encoded in the computer readable storage medium 414 in order to cause the computer 410 to be usable as a placing and routing tool for performing a portion or all of the operations as depicted in FIG. 3. In at least one embodiment, the hardware processor 412 is configured to execute the set of instructions 414c for generating the integrated circuit layout based on the layout of the standard cell and a nominal minimum pitch corresponding to a predetermined semiconductor manufacturing process.

In some embodiments, the processor 412 is a central processing unit (CPU), a multi-processor, a distributed processing system, an application specific integrated circuit (ASIC), and/or a suitable processing unit.

In some embodiments, the computer readable storage medium 414 is an electronic, magnetic, optical, electromagnetic, infrared, and/or a semiconductor system (or apparatus or device). For example, the computer readable storage medium 414 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 414 includes a compact disk-read only memory (CD-ROM), a compact disk-read/write (CD-R/W), and/or a digital video disc (DVD).

In some embodiments, the storage medium 414 stores the computer program code 414c configured to cause the first computer system 410 to perform a method 300 as depicted in FIG. 3. In some embodiments, the storage medium 414 also stores information needed for performing the method 300 or generated during performing the method 300, such as the generated integrated circuit layout 414a, the original circuit design 414b, and/or a library 414d including layouts of standard cells.

The computer system 410 includes, in at least some embodiments, an input/output interface 416 and a display unit 417. The input/output interface 416 is coupled to the controller 412 and allows the circuit designer to manipulate the first computer system 410 in order to perform the method depicted in FIG. 3. In at least some embodiments, the display unit 417 displays the status of operation of the method depicted in FIG. 3 in a real-time manner and preferably provides a Graphical User Interface (GUI). In at least some embodiments, the input/output interface 416 and the display 417 allow an operator to operate the computer system 410 in an interactive manner.

In at least some embodiments, the computer system 410 also includes a network interface 418 coupled to the processor 412. The network interface 418 allows the computer system 410 to communicate with network 440, to which one or more other computer systems 420 and networked storage device 430 are connected. The network interface includes wireless network interfaces such as BLUETOOTH, WIFI, WIMAX, GPRS, or WCDMA; or wired network interface such as ETHERNET, USB, or IEEE-1394. In some embodiments, the method of FIG. 3 is implemented in two or more computer systems 410 and 420 and/or networked storage device 430, and information such as the original circuit design, the standard cell library, and/or the generated integrated circuit layout are exchanged between different computer systems 410 and 420 and/or networked storage device 430 via the network 440.

An aspect of this description relates to an integrated circuit designing system. The integrated circuit designing system includes a non-transitory storage medium. The non-transitory storage medium is encoded with a first set of standard cell layouts and a second set of standard cell layouts both corresponding to a predetermined manufacturing process and being configured to perform a predetermined function, the predetermined manufacturing process having a nominal minimum pitch (T) of metal lines along a predetermined direction, each standard cell layout of the first set of standard cell layouts and the second set of standard cell layouts having a cell height (H) along the predetermined direction wherein the cell height is a non-integral multiple of the nominal minimum pitch. The integrated circuit designing system further includes a hardware processor communicatively coupled with the non-transitory storage medium. The hardware processor is configured to execute a set of instructions for generating an integrated circuit layout based on the first set of standard cell layouts, the second set of standard cell layouts and the nominal minimum pitch, wherein each standard cell layout of the second set of standard cell layouts corresponds to a transformed version of a corresponding standard cell layout in the first set of standard cell layouts; and creating a new data file corresponding to the integrated circuit layout for storing on the non-transitory storage medium. In some embodiments, each standard cell layout in the second set of standard cell layouts includes a version of the corresponding standard cell layout in the first set of standard cell layouts rotated by 180 degrees with respect to a center of the corresponding standard cell layout of the first set of standard cells layouts. In some embodiments, each standard cell layout in the second set of standard cell layouts comprises a version of the corresponding standard cell layout of the first set of standard cell layouts mirrored along a cell boundary of the corresponding standard cell layout of the first set of standard cell layouts. In some embodiments, the hardware processor, while executing the set of instructions, is configured to generate an array of virtual grid lines arranged in parallel along a direction perpendicular to the predetermined direction with adjacent virtual grid lines being separated by the nominal minimum pitch; place a first standard cell layout selected from one of the first set of standard cell layouts or the second set of standard cell layouts in the integrated circuit layout whereby centers of corresponding input/output ports of the first standard cell coincide with a first set of the virtual grid lines; and place a first metal pattern layout in the integrated circuit layout, the first metal pattern layout coinciding with a second set of the virtual grid lines. In some embodiments, the hardware processor, while executing the set of instructions, is further configured to allocate N cell rows, including a row for placing the selected first standard cell layout, in the integrated circuit layout, the N cell rows abutting one another along the predetermined direction, and wherein N is a smallest integer whereby the product of the expression N*H is an integral multiple of the nominal minimum pitch; and select from among the sets of standard cell layouts according to the row relative to the N cell rows. In some embodiments, the hardware processor, while executing the set of instructions, is further configured to allocate N cell rows, including a i-th cell row to a (i+N−1)-th cell row sequentially arranged along the predetermined direction, and the selected standard cell layout being placed at (i+n)-th row of the N cell rows, n being a non-negative integer, and N and i being positive integers; and select a k-th type standard cell of the set of standard cells as the standard cell according to the following equations:

$$k = (n + 1), \text{ if } n \text{ is less than } \frac{N}{2}; \text{ and}$$

$$k = (N - n), \text{ if } n \text{ is no less than } \frac{N}{2}.$$

In some embodiments, N ranges from 2 to 8. In some embodiments, the predetermined function is a logic operation including one or more of AND, OR, NAND, NOR, XOR, INV, AOI, OAI, MUX, Flip-flop, BUFF, Latch, delay, or clock operations.

An aspect of this description relates to an integrated circuit designing system. The integrated circuit designing system includes a non-transitory storage medium. The non-transitory storage medium is encoded with a nominal minimum pitch of grid lines for metal lines along a predetermined direction, and a cell library. The cell library includes a first standard cell having a first cell height that is a non-integer multiple of the nominal minimum pitch, wherein the first standard cell is configured to perform a predetermined function, and a second standard cell having a second cell height that is a non-integer multiple of the nominal minimum pitch, wherein the second standard cell is configured to perform the predetermined function. The integrated circuit designing system further includes a processor communicatively coupled with the non-transitory storage medium. The processor is configured to execute a set of instructions for generating an integrated circuit layout including the first standard cell and the second standard cell, wherein multiple boundaries of at least one of the first standard cell or the second standard cell are offset from the grid lines; and creating a new data file corresponding to the integrated circuit layout for storing on the non-transitory storage medium. In some embodiments, the processor is configured to execute the set of instructions for generating the integrated circuit layout including at least one boundary of each of the first standard cell and the second standard cell is offset from the grid lines. In some embodiments, the first standard cell has a first layout, and the second standard cell has a second layout different from the first layout. In some embodiments, the second layout is rotated 180-degrees with respect to the first layout. In some embodiments, the first standard cell comprises a first port configured to connect to a first structure in the first standard cell, the second standard cell comprises a second port configured to connect to the first structure in the second standard cell, and a location of the first port in the first standard cell is different from a location of the second port in the second standard cell. In some embodiments, the processor is configured to execute the set of instructions for generating the integrated circuit layout including the first port and on the second port aligned with corresponding grid lines of the grid lines. In some embodiments, the predetermined function is a logic operation including one or more of AND, OR, NAND, NOR, XOR, INV, AOI, OAI, MUX, Flip-flop, BUFF, Latch, delay, or clock operations.

An aspect of this description relates to an integrated circuit designing system. The integrated circuit designing system includes a non-transitory storage medium. The non-transitory storage medium is encoded a nominal minimum pitch of grid lines for metal lines along a predetermined direction, and a cell library. The cell library includes a first standard cell having a first cell height that is a non-integer multiple of the nominal minimum pitch, wherein the first standard cell is configured to perform a predetermined function, the first standard cell has a first boundary and a second boundary spaced in the predetermined direction, and the first standard cell has a first layout, and a second standard cell having a second cell height that is a non-integer multiple of the nominal minimum pitch, wherein the second standard cell is configured to perform the predetermined function, the second standard cell has a third boundary and a fourth boundary spaced in the predetermined direction, the second standard cell has a second layout, and the second layout is rotated 180-degrees with respect to the first layout. The integrated circuit designing system further includes a processor communicatively coupled with the non-transitory storage medium. The processor is configured to execute a set of instructions for generating an integrated circuit layout including the first standard cell and the second standard cell, wherein the first boundary is offset from the grid lines, and the third boundary is offset from the grid lines; and creating a new data file corresponding to the integrated circuit layout for storing on the non-transitory storage medium. In some embodiments, the processor is configured to execute the set of instructions for generating the integrated circuit layout having at least one of the second boundary or the fourth boundary offset from the grid lines. In some embodiments, the processor is configured to execute the set of instructions for generating the integrated circuit layout having at least one of the second boundary or the fourth boundary align with a corresponding grid line of the grid lines. In some embodiments, the first layout includes a first port spaced from the first boundary by a first distance, the second layout includes a second port spaced from the third boundary by a second distance different from the first distance, and the processor is configured to execute the set of instructions for generating the integrated circuit layout having the first port and the second port aligned with corresponding grid lines of the grid lines. In some embodiments, the predetermined function is a logic operation including one or more of AND, OR, NAND, NOR, XOR, INV, AOI, OAI, MUX, Flip-flop, BUFF, Latch, delay, or clock operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit designing system, comprising:
   a non-transitory storage medium, the non-transitory storage medium being encoded with:
      a first set of standard cell layouts and a second set of standard cell layouts both corresponding to a predetermined manufacturing process and being configured to perform a predetermined function,
      the predetermined manufacturing process having a nominal minimum pitch (T) of metal lines along a predetermined direction,
      each standard cell layout of the first set of standard cell layouts and the second set of standard cell layouts having a cell height (H) along the predetermined direction wherein the cell height is a non-integral multiple of the nominal minimum pitch; and
   a hardware processor communicatively coupled with the non-transitory storage medium and configured to execute a set of instructions for:
   generating an integrated circuit layout based on the first set of standard cell layouts, the second set of standard cell layouts and the nominal minimum pitch, wherein each standard cell layout of the second set of standard cell layouts corresponds to a transformed version of a corresponding standard cell layout in the first set of standard cell layouts; and
   creating a new data file corresponding to the integrated circuit layout for storing on the non-transitory storage medium.

2. The integrated circuit designing system according to claim 1, wherein:
   each standard cell layout in the second set of standard cell layouts comprises a version of the corresponding standard cell layout in the first set of standard cell layouts rotated by 180 degrees with respect to a center of the corresponding standard cell layout of the first set of standard cells layouts.

3. The integrated circuit designing system according to claim 1, wherein:
   each standard cell layout in the second set of standard cell layouts comprises a version of the corresponding standard cell layout of the first set of standard cell layouts mirrored along a cell boundary of the corresponding standard cell layout of the first set of standard cell layouts.

4. The integrated circuit designing system of claim 1, wherein the hardware processor, while executing the set of instructions, is configured to:
   generate an array of virtual grid lines arranged in parallel along a direction perpendicular to the predetermined direction with adjacent virtual grid lines being separated by the nominal minimum pitch;
   place a first standard cell layout selected from one of the first set of standard cell layouts or the second set of standard cell layouts in the integrated circuit layout whereby centers of corresponding input/output ports of the first standard cell coincide with a first set of the virtual grid lines; and
   place a first metal pattern layout in the integrated circuit layout, the first metal pattern layout coinciding with a second set of the virtual grid lines.

5. The integrated circuit designing system of claim 4, wherein the hardware processor, while executing the set of instructions, is further configured to:
   allocate N cell rows, including a row for placing the selected first standard cell layout, in the integrated circuit layout, the N cell rows abutting one another along the predetermined direction, and wherein N is a smallest integer whereby the product of the expression N*H is an integral multiple of the nominal minimum pitch; and
   select from among the sets of standard cell layouts according to the row relative to the N cell rows.

6. The integrated circuit designing system of claim 4, wherein the hardware processor, while executing the set of instructions, is further configured to:
   allocate N cell rows, including a i-th cell row to a (i+N−1)-th cell row sequentially arranged along the predetermined direction, and the selected standard cell layout being placed at (i+n)-th row of the N cell rows, n being a non-negative integer, and N and i being positive integers; and
   select a k-th type standard cell of the set of standard cells as the standard cell according to the following equations:

$$k = (n+1), \text{ if } n \text{ is less than } \frac{N}{2}; \text{ and}$$

$$k = (N-n), \text{ if } n \text{ is no less than } \frac{N}{2}.$$

7. The integrated circuit designing system of claim 6, wherein N ranges from 2 to 8.

8. The integrated circuit designing system of claim 1, wherein the predetermined function is a logic operation including one or more of AND, OR, NAND, NOR, XOR, Invert (INV), AND-OR-Invert (AOI), OR-AND-Invert (OAI), MUX, Flip-flop, BUFF, Latch, delay, or clock operations.

9. An integrated circuit designing system, comprising:
a non-transitory storage medium, the non-transitory storage medium being encoded with:
a nominal minimum pitch of grid lines for metal lines along a predetermined direction, and
a cell library, wherein the cell library comprises:
a first standard cell having a first cell height that is a non-integer multiple of the nominal minimum pitch, wherein the first standard cell is configured to perform a predetermined function, and
a second standard cell having a second cell height that is a non-integer multiple of the nominal minimum pitch, wherein the second standard cell is configured to perform the predetermined function; and
a processor communicatively coupled with the non-transitory storage medium and configured to execute a set of instructions for:
generating an integrated circuit layout including the first standard cell and the second standard cell, wherein multiple boundaries of at least one of the first standard cell or the second standard cell are offset from the grid lines; and
creating a new data file corresponding to the integrated circuit layout for storing on the non-transitory storage medium.

10. The integrated circuit designing system of claim 9, wherein the processor is configured to execute the set of instructions for generating the integrated circuit layout including at least one boundary of each of the first standard cell and the second standard cell is offset from the grid lines.

11. The integrated circuit designing system of claim 9, wherein the first standard cell has a first layout, and the second standard cell has a second layout different from the first layout.

12. The integrated circuit designing system of claim 11, wherein the second layout is rotated 180-degrees with respect to the first layout.

13. The integrated circuit designing system of claim 9, wherein the first standard cell comprises a first port configured to connect to a first structure in the first standard cell, the second standard cell comprises a second port configured to connect to the first structure in the second standard cell, and a location of the first port in the first standard cell is different from a location of the second port in the second standard cell.

14. The integrated circuit designing system of claim 13, wherein the processor is configured to execute the set of instructions for generating the integrated circuit layout including the first port and on the second port aligned with corresponding grid lines of the grid lines.

15. The integrated circuit designing system of claim 9, wherein the predetermined function is a logic operation including one or more of AND, OR, NAND, NOR, XOR, Invert (INV), AND-OR-Invert (AOI), OR-AND-Invert (OAI), MUX, Flip-flop, BUFF, Latch, delay, or clock operations.

16. An integrated circuit designing system, comprising:
a non-transitory storage medium, the non-transitory storage medium being encoded with:
a nominal minimum pitch of grid lines for metal lines along a predetermined direction, and
a cell library, wherein the cell library comprises:
a first standard cell having a first cell height that is a non-integer multiple of the nominal minimum pitch, wherein the first standard cell is configured to perform a predetermined function, the first standard cell has a first boundary and a second boundary spaced in the predetermined direction, and the first standard cell has a first layout, and
a second standard cell having a second cell height that is a non-integer multiple of the nominal minimum pitch, wherein the second standard cell is configured to perform the predetermined function, the second standard cell has a third boundary and a fourth boundary spaced in the predetermined direction, the second standard cell has a second layout, and the second layout is rotated 180-degrees with respect to the first layout; and
a processor communicatively coupled with the non-transitory storage medium and configured to execute a set of instructions for:
generating an integrated circuit layout including the first standard cell and the second standard cell, wherein the first boundary is offset from the grid lines, and the third boundary is offset from the grid lines; and
creating a new data file corresponding to the integrated circuit layout for storing on the non-transitory storage medium.

17. The integrated circuit designing system of claim 16, wherein the processor is configured to execute the set of instructions for generating the integrated circuit layout having at least one of the second boundary or the fourth boundary offset from the grid lines.

18. The integrated circuit designing system of claim 16, wherein the processor is configured to execute the set of instructions for generating the integrated circuit layout having at least one of the second boundary or the fourth boundary align with a corresponding grid line of the grid lines.

19. The integrated circuit designing system of claim 16, wherein the first layout includes a first port spaced from the first boundary by a first distance, the second layout includes a second port spaced from the third boundary by a second distance different from the first distance, and the processor is configured to execute the set of instructions for generating the integrated circuit layout having the first port and the second port aligned with corresponding grid lines of the grid lines.

20. The integrated circuit designing system of claim 16, wherein the predetermined function is a logic operation including one or more of AND, OR, NAND, NOR, XOR, Invert (INV), AND-OR-Invert (AOI), OR-AND-Invert (OAI), MUX, Flip-flop, BUFF, Latch, delay, or clock operations.

* * * * *